United States Patent [19]

Ebihara et al.

[11] Patent Number: 5,040,149
[45] Date of Patent: Aug. 13, 1991

[54] SEMICONDUCTOR MEMORY WITH DIVIDED READOUT FROM STORAGE

[75] Inventors: Norio Ebihara; Takayuki Sasaki; Hiroyuki Kita; Yoshihito Ohsawa, all of Kanagawa, Japan

[73] Assignee: Sony Corporation, Tokyo, Japan

[21] Appl. No.: 496,076

[22] Filed: Mar. 15, 1990

Related U.S. Application Data

[63] Continuation of Ser. No. 41,406, Apr. 23, 1987, abandoned.

[30] Foreign Application Priority Data

Apr. 28, 1986 [JP] Japan ................................ 61-98847
Apr. 30, 1986 [JP] Japan ............................... 61-100044

[51] Int. Cl.⁵ ...................... G11C 7/00; G11C 11/409; G11C 11/416
[52] U.S. Cl. .................... 365/189.05; 365/230.03; 365/230.04; 365/220; 365/219
[58] Field of Search ................. 365/189.04, 189.05, 365/219, 230.04, 230.05, 230.03, 239, 220

[56] References Cited

U.S. PATENT DOCUMENTS

| | | | |
|---|---|---|---|
| 4,541,075 | 9/1985 | Dill et al. ................ | 365/219 X |
| 4,541,076 | 9/1985 | Bowers et al. .......... | 365/189 X |
| 4,567,579 | 1/1986 | Patel et al. ............. | 365/189 |
| 4,608,671 | 8/1986 | Shimizu et al. ........ | 365/189 X |
| 4,630,230 | 12/1986 | Sundet ................... | 365/189.05 X |
| 4,648,077 | 3/1987 | Pinkham et al. ....... | 365/189 X |
| 4,688,197 | 8/1987 | Novak et al. .......... | 365/230 |
| 4,701,884 | 10/1987 | Aoki et al. ............. | 365/221 X |
| 4,725,987 | 2/1988 | Cates ..................... | 365/189 X |
| 4,747,081 | 5/1988 | Heilveil et al. ........ | 365/219 |
| 4,777,624 | 10/1988 | Ishizawa et al. ....... | 365/189 |
| 4,789,960 | 12/1988 | Willis .................... | 365/189.05 X |

OTHER PUBLICATIONS

Wescon Technical Papers, vol. 16, 19th–22nd Sep. 1972, pp. 413.1–413.5; Y. Hsia: "Memory Applications of the MNOS", p. 413.3, left-hand column, line 23, p. 413.4, left-hand column, line 10.

IEEE Journal of Solid-State Circuits, vol. SC-19, No. 6, Dec. 1984, pp. 999-1007; R. Pinkham et al: "A High Speed Dual Port Memory with Simultaneous Serial and Random Mode Access for Video Applications", FIGS. 1,6, p. 999, line 14, line 10; p. 1003, line 15, line 21.

Patent Abstracts of Japan, vol. 7, No. 249 (P234[1384], 5th Nov. 1983; & JP-A-58 133 698 (Nippon Denki K.K.) 09-08-1983.

SMPTE Journal, vol. 89, No. 4, Apr. 1984, pp. 257-262; T. Yoshino et al: "Digital Frame Memory for Still Picture Television Receivers PASS Encoding System and Application", FIG. 15, p. 261, col. 3, line 17, p. 262, col. 1, line 19.

Primary Examiner—Alyssa H. Bowler
Attorney, Agent, or Firm—Ronald P. Kananen

[57] ABSTRACT

A semiconductor memory includes an input buffer means for storing inputted data, an output buffer means for storing the data and for outputting the data and a storage means for storing the data outputted from the input buffer means and for transferring the data to the output buffer means. The input buffer means includes a plurality of memories having equal capacity. The output buffer means also includes a plurality of memories having equal capacity. The memory means have memory capacity of a divisor of memory capacity per line of the storage means. In addition, the semiconductor memory can also include a dividing means for dividing image data outputted from said input buffer into smaller data units to be written on said storage means and a recombining means for said smaller data units outputted from said storage means to supply to said output buffer means.

18 Claims, 6 Drawing Sheets

SEMICONDUCTOR MEMORY WITH DIVIDED READOUT FROM STORAGE

This application is a continuation, of application Ser. No. 07/041,406, filed Apr. 23, 1987.

BACKGROUND OF THE INVENTION

1. (FIELD OF THE INVENTION)

The present invention relates to a semiconductor memory which can be used in, for example, the image processing in a video tape recorder, television or the like. More specifically, the invention relates to a semiconductor memory which can be applied to an asynchronous 3-port FIFO memory.

2. (DESCRIPTION OF THE BACKGROUND ART)

Asynchronous 3-port FIFO memories, which have serial-access memories (SAM) writing and reading out data, line by line, are known. Such types of memories include first, second and third SAM's. The first SAM comprises a selector, a register which may have, for example, a capacity of 1024 bits, and a first latch circuit. The second SAM comprises a second latch circuit and a first shift register. The third SAM comprises a third latch circuit and a second shift register.

Writing clock signals CKW are supplied for the selector, the register and the first latch circuit. Serial data are supplied for the register by means of an input terminal. When clear signals CLR0 are supplied to the selector, the data are cleared to be set to 0. The selector is actuated by means of write enable signals WE. Address signals are formed when clock signals CKW are supplied for the selector. The address signals are supplied for the register by means of the selector. Serial data from the input terminal are stored in the register at predetermined locations designated by the address signals. The data stored in the register is temporarily latched by the first latch circuit.

The data latched by the first latch circuit is written, line by line, on a dynamic random-access memory (DRAM) at a predetermined location assigned by address signals produced from a writing address circuit.

The data written on the DRAM at a predetermined location assigned by address signals produced from a first read-out address circuit is read out, line by line, to be transferred to the second latch circuit to be further transferred to the first shift register. Read-out clock signals CKR 1 are supplied for the first read-out address circuit, the second latch circuit and the first shift register. Clear signals CLR 1 are also supplied for the first shift register.

The data transferred to the first shift register is shifted by 1-bit whenever the clock signals CKL 1 are outputted to a first output terminal to serve as first data.

On the other hand, the data written on the DRAM at a predetermined location assigned by address signals, which are produced from a second read-out address circuit, is read out, line by line, to be transferred to the third latch circuit to be further transferred to the second shift register. Read-out clock signals CKL 2 are supplied for the second address circuit, the third latch circuit and the second shift register. Clear signals CLR 2 are also supplied for the second shift register.

The data transferred to the second shift register is shifted by 1-bit whenever the clock signals CKL 2 are outputted to a second output terminal to serve as second data.

A first port comprises the selector, the register, and the first latch circuit. A second port comprises the second latch circuit and the first shift register. A third port comprises the third latch circuit and the second shift register. As mentioned above, the first, second and third ports can actuate asynchronously of each other.

However, in the above-mentioned device, there is a disadvantage in that size of he chips is relatively large so that cost becomes high since the area of the SAM including the register, the latch circuit and so forth is relatively large. In addition, the device does not have good operating efficiency.

SUMMARY OF THE INVENTION

It is therefore a principle object of the present invention to eliminate the aforementioned disadvantage and to provide an inexpensive semiconductor memory which has a high operating efficiency and small chip size.

It is another object of the invention to provide a semiconductor memory in which a wiring area of data lines is small.

In order to accomplish the aforementioned and other specific objects, a semiconductor memory according to the present invention includes an input buffer means for storing inputted data, an output buffer means for storing the data and for outputting the data and a storage means for storing the data outputted from the input buffer means and for transferring the data to the output buffer means. The input buffer means includes a plurality of memory means each having an equal memory capacity. The output buffer means also includes a plurality of memory means each having an equal memory capacity. The memory means have a memory capacity of a divisor of the memory capacity per line of the storage means.

In addition, the semiconductor memory can be connected to first and second address designating means for producing address signals and for designating the location to and from which the data are transferred, respectively.

The input buffer means can include first and second memory means. In this case, the semiconductor memory can include a first switching means for transferring data stored in the first memory means to the storage means when data is written on the second memory means and for transferring data stored in the second memory means to the storage means when data is written on the first memory means. The output buffer means can include third and fourth memory means. The semiconductor memory can include a second switching means for reading out data written on the third memory means when data outputted from the storage means is transferred to the fourth memory means and for reading out data written on the fourth memory means when data outputted from the storage means is transferred to the third memory means.

The input and output buffer means preferably comprises a plurality of serial-access memories and the storage means preferably comprises a dynamic random-access memory. In a preferable construction, the semiconductor memory is provided with a toggle means for delaying one of the data transfers in relation to the other so that the data transfer from the input buffer means to the storage means does not conflict with the data transfer from the storage means to the output buffer means.

According to one aspect of the present invention, the semiconductor memory comprises:

an input buffer means for storing inputted data;

a storage means for storing the data outputted from the input buffer means;

an output buffer means for storing the data outputted from the storage means and for reading out the data;

a dividing means for dividing data outputted from said input buffer into smaller data units to be written in said storage means; and a recombining means for recombining said smaller data units outputted from said storage means to be supplied to said output buffer means.

BRIEF DESCRIPTION OF THE DRAWINGS

The present invention will be understood more fully from the detailed description given herebelow and from the accompanying drawings of the preferred embodiment of the invention. The drawings are not intended to imply limitation of the invention to this specific embodiment, but are for explanation and understanding only.

In the drawings.

DESCRIPTION OF THE PREFERRED EMBODIMENT

Figure 1:
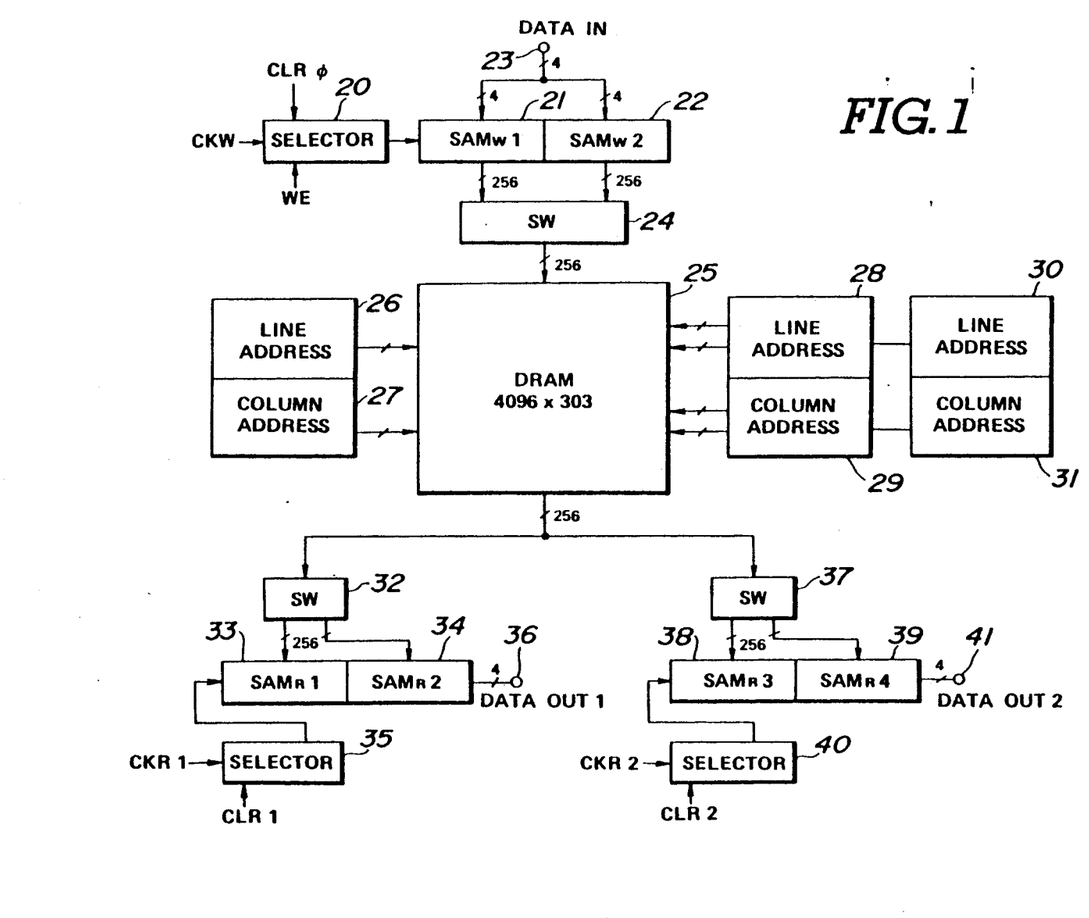
FIG. 1 is a block diagram of the preferred embodiment of a semiconductor memory according to the present invention.

Referring now to the drawings, particularly to FIG. 1, the preferred embodiment of a semiconductor memory, according to the present invention, is applied to an asynchronous 3-port FIFO field memory. The semiconductor memory includes a selector 20. When clear signals CLR0 are supplied for the selector 20, the data is set to 0 to be cleared. The selector 20 is actuated by means of write enable signals WE. When clock signals CKW are supplied for the selector 20, address signals are formed. The selector 20 is connected to writing serial-access memories (SAM) 21 and 22 which have equal capacities to each other. For example, the SAM's 21 and 22 each have 256 bits of memory capacity, respectively. When data, in which a pixel is formed by 4 bits, are supplied for the SAM's 21 and 22 by means of an input terminal 23, the data are written on the SAM's 21 and 22 at a predetermined location designated by address signals. The SAM's 21 and 22 respectively have addresses numbered from 0 to 63 corresponding to 64 pixels since they have bits of memory capacity. Therefore, 4-bits of data inputted from the input terminal 23 are, in turn, written on the address designated by the address signals. The data written on the SAM's 21 and 22 are, in turn, picked up by means of a switch circuit 24 and supplied to a memory means, for example, a dynamic random-access memory (DRAM) 25. The data stored in the SAM 21 is transferred to the DRAM 25 when data is written on the SAM 22 and, conversely, the data stored in the SAM 22 is transferred to the DRAM 25 when data is written on the SAM 21. A first port comprises the selector 20, the SAM's 21 and 22, the input terminal 23 and the switch circuit 24.

The DRAM 25 may have, for example, 303 lines of capacity in which each line includes 4096 bits (4096×303) total bits, each line may be divided into 16 blocks having 256 bits for example, the DRAM 25 is connected to a writing line-address circuit 26 and a writing column-address circuit 27. The line address circuit 26 produces address signals to designate the line of the DRAM 25 on which the data is to be written. The column-address circuit 27 produces address signals to designate the column of the DRAM 25 on which the data is to be written. As a result, each 256-bit of data outputted from the SAM 21 or 22 can be written on a predetermined block of the DRAM 25.

The DRAM 25 is also connected to a first read-out line-address circuit 28 and a first read-out column-address circuit 29. The first read-out line-address circuit 28 produces address signals to designate the line of the DRAM from which the data is to be read out. The first read-out column-address circuit 29 produces address signals to designate the column of the DRAM 25 from which the data is to be read out. As a result, the 256 bits of data written on a predetermined block of the DRAM 25 can be read out.

The DRAM 25 is further connected to a second read-out line-address circuit 30 and a second read-out column-address circuit 31. The second read-out line-address circuit 30 produces address signals to designate the line of the DRAM 25 from which the data is to be read out. The second read-out column-address circuit 31 produces address signals to designate the column of the DRAM 25 from which, the data is to be read out. As a result, the 256-bits of data written on a predetermined block of the DRAM 25 can be read out.

The output terminal of the DRAM 25 is connected to a switch circuit 32. The switch circuit 32 is also connected to SAM's 33 and 34 which have the same capacity as that of the SAM's 21 and 22. The SAM's 33 and 34 are connected to a selector 35, which can operate in a similar manner to the selector 20, and an output terminal 36. A first output buffer means, which is a second port, comprises the SAM's 33 and 34, the selector 35 and the output terminal 36. The address circuits 28 and 29 produce address signals to designate 256 bits of data written on a predetermined block of the DRAM 25 to be read out. The 256 bits of data are selectively picked up by means of the switch circuit 32 and transferred to the SAM 33 or 34. The data written on the SAM 33 is read out while data outputted from the DRAM 25 is transferred to the SAM 34. Conversely, the data written on the SAM 34 is read out while data outputted from the DRAM 25 are transferred to the SAM 33. Data stored in the SAM 33 or 34 at a predetermined location designated by address signals, which are produced from the selector 35, is outputted to the output terminal 36, 4-bits by 4-bits, i.e. pixel by pixel.

The output terminal of the DRAM 25 is also connected to a switch circuit 37. The switch circuit 37 is also connected to SAM's 38 and 39 which have the same capacity as that of the SAM's 21 and 22. The SAM's 38 and 39 are connected to a selector 40, which can operate in a similar manner to the selector 20, and an output terminal 41. A second output buffer means, which is a third port, comprises the SAM's 38 and 39, the selector 40 and the output terminal 41. The address circuits 30 and 31 produce address signals to designate 256 bits of data written on a predetermined block of the DRAM 25 to be read out. The 256 bits of data are selectively picked up by means of the switch circuit 37 and transferred to the SAM 38 or 39. The data written on the SAM 38 are read out while data outputted from the DRAM 25 is transferred to the SAM 39. Conversely, the data written on the SAM 39 is read out while data outputted from the DRAM 25 is transferred to the SAM 38. Data stored in the SAM 38 or 39 at a predetermined location designated by address signals, which are produced from the selector 40, is outputted to the output terminal 41, 4-bits at a time, i.e. pixel by pixel.

According to the preferred embodiment of a semiconductor memory of the invention, a toggle means is provided so that the data transfer from the SAM 21 or 22 to the DRAM 25 does not conflict with the data transfer from the DRAM 25, to the SAM 33, 34, 38 or 39. One of the data transfers is delayed relative to the other by means of the toggle means.

Figure 2:
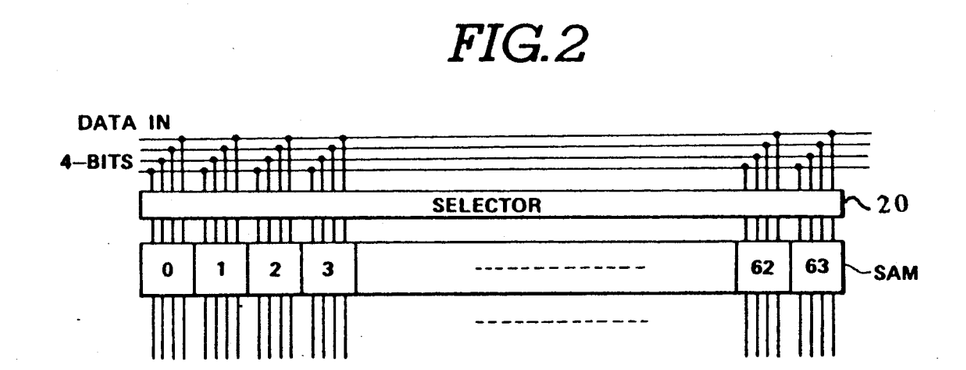
FIG. 2 is a diagram of the preferred embodiment of a serial access memory constituted of an input buffer means which is used in the memory shown in FIG. 1.

As shown in FIG. 2, the inputted 4-bit data units can be selected by means of the selector 20 and written on the SAM 21 or 22, which is constituted of an input buffer means, at predetermined locations corresponding to the address numbered from 0 to 63.

Figure 3:
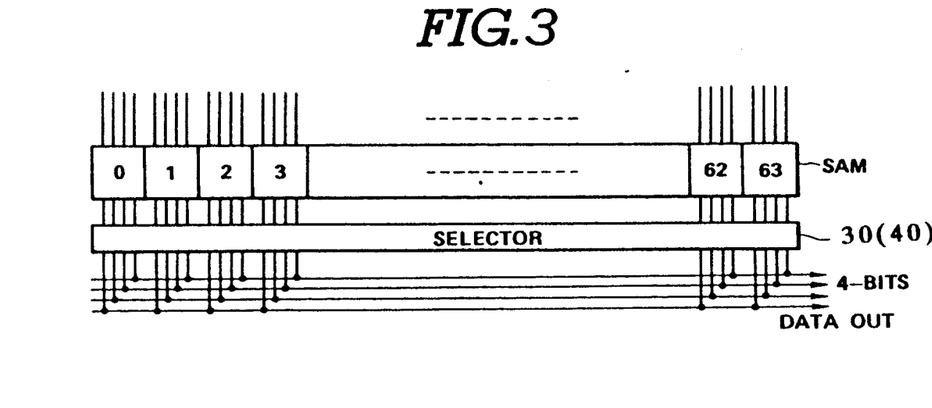
FIG. 3 is a diagram of the preferred embodiment of a serial-access memory constituted of an output buffer means which is used in the memory shown in FIG. 1.

As shown in FIG. 3, each of the 4-bit data units written on the SAM 33 or 34 at the addresses numbered from 0 to 63 can be selected by means of the selector 35 and outputted. Each 4-bit data unit written on the SAM 38 or 39 at the addresses numbered from 0 to 63 can also be selected by means of the selector 40 and outputted.

Figure 4:
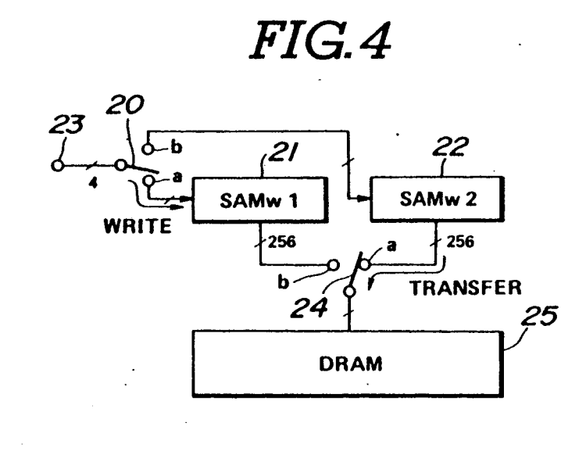
FIG. 4 is a block schematic diagram of the preferred embodiment of the input buffer means.

FIG. 4 shows the input buffer means for transferring data from the SAM 21 or 22 to the DRAM 25. In FIG. 4, the selector 20 is expressed as a single-pole double-throw switch for reasons of convenience. The selector 20 is associated with the switch 24. The switch circuit 24 is in contact with an a contact when the selector 20 is in contact with the a contact. Conversely, the switch circuit 24 is in contact with a b contact when the selector 20 is in contact with the b contact. Therefore, when both the selector 20 and the switch circuit 24 are in contact with the a contact, each of 4-bit data units inputted from the input terminal 23 is, in turn, written on the SAM 21 and simultaneously the 256-bits data written on the SAM 22 is transferred to the DRAM 25. Conversely, when both the selector 20 and the switch circuit 24 are in contact with the b contact, each of 4-bits data inputted into the input terminal 23 is, in turn, written on the SAM 22 and simultaneously the 256-bit data written on the SAM 21 is transferred to the DRAM 25.

Figure 5:
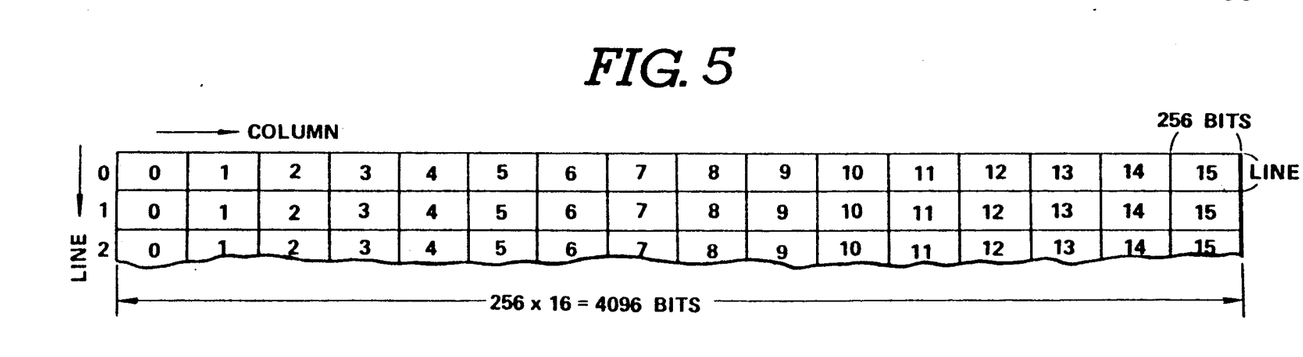
FIG. 5 is a schematic diagram of the preferred embodiment of the output buffer means.

As shown in FIG. 5, the DRAM 25 may include 303 lines arranged vertically, each of which may be divided into 16 blocks numbered from 0 to 15. One block may have 256 bits of capacity and one line may have 4096 bits (256×16) of capacity. Therefore, there is a map comprising 16 columns ×303 lines.

As mentioned above, each of 256 bits data transferred from the SAM's 21 and 22 is, in turn, written on a predetermined block, the line and column of which are assigned by the address circuits 26 and 27, respectively, shown in FIG. 1.

Figure 6:
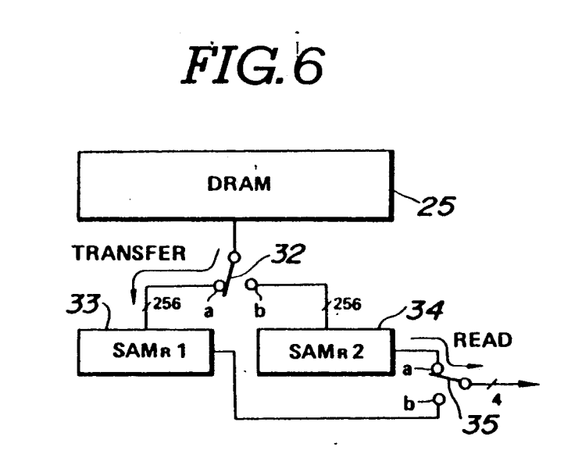
FIG. 6 is a block diagram of the preferred embodiment of a dynamic-random-access memory used in the memory shown in FIG. 1.

FIG. 6 shows the first output buffer means for transferring data from the DRAM 25 to the SAM 33 or 34. In FIG. 6, the selector 35 is expressed as a single-pole double-throw switch for reasons of convenience. The switch circuit 32 is associated with the selector 35. The switch circuit 32 is in contact with an a contact when the selector 35 is in contact with the a contact. Conversely, the switch circuit 32 is in contact with a b contact when the selector 20 is in contact with the b contact. Therefore, when both the selector 35 and the switch circuit 32 are in contact with the a contact, the 256-bits of data written on the DRAM 25 at a predetermined block, the line and column of which have been determined by means of the address circuits 28 and 29 shown in FIG. 1, are transferred to the SAM 33 and simultaneously 256 bits of data written on the SAM 34 are, in turn, outputted 4-bits at a time. To the contrary, when both of the selector 35 and the switch circuit 32 are in contact with the b contact, the 256 bits data written on the DRAM 25 at a predetermined block, the line and column of which have been determined by means of the address circuits 28 and 29, are transferred to the SAM 34 and simultaneously the 256 bits of data written on the SAM 33 are, in turn, outputted 4 bits at a time.

Figure 7:
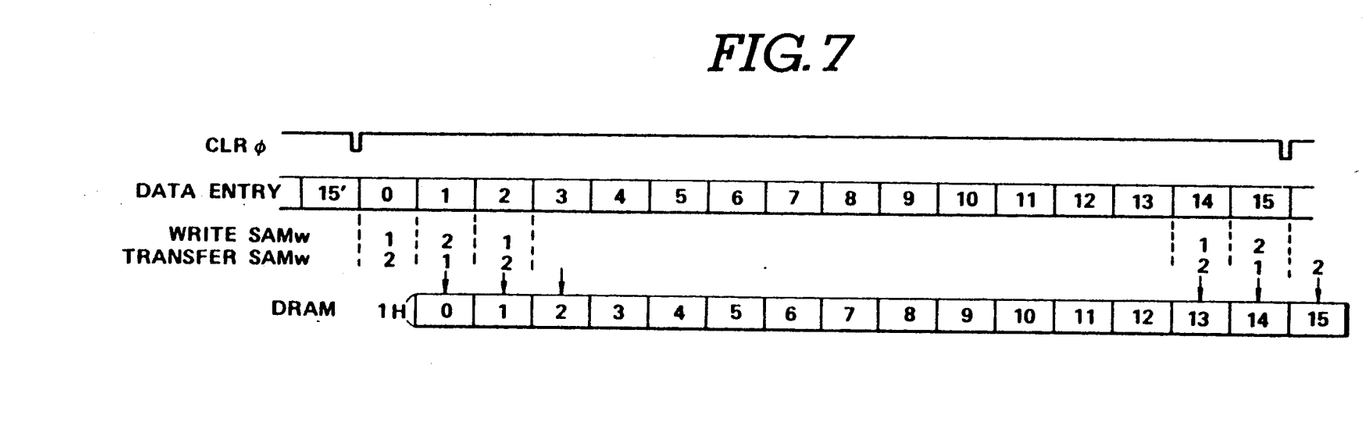
FIG. 7 is a diagram showing the timing relationship between the dynamic random-access memory and the serial-access memory constituted of the input buffer means.

FIG. 7 shows the timing relationship between the DRAM 25 and the SAM's 21 and 22 which constitute the input buffer means. When clear signals CLR 0 are applied to the selector 20, the 256-bits of data to be written on the DRAM 25 at the block 0 are written on the SAM serving as a writing SAM, for example, the SAM 21 add simultaneously the 256 bits of data written on the SAM 2 serving as a transferring SAM, for example, the SAM 22, are transferred to the block 15 of the DRAM 25. Secondly, the 256 bits of data to be written on the DRAM 25 at the block 11 are written on the SAM 2 serving as the writing SAM and simultaneously the 256 bit of data written on the SAM 1 serving as the transferring SAM are transferred to the block 0 of the DRAM 25. Next, the 256 bits of data to be written on the DRAM 25 at the block 2 are written on the SAM 1 serving as the writing SAM and simultaneously the 256 bits of data written on the SAM 2 serving as the transferring SAM are transferred to the block 1 of the DRAM 25. Data written on one SAM is transferred to the DRAM 25 while data is written on the other SAM. This operation is repeated until the transfer of all of the data is finished.

Figure 8:
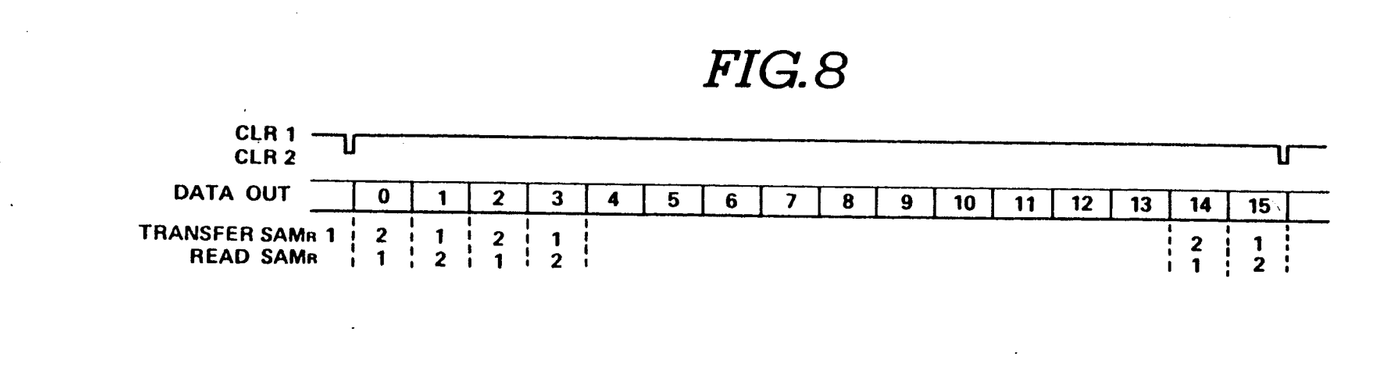
FIG. 8 is a diagram showing the timing relationship between the dynamic random-access memory and the serial-access memory constituted of the output buffer means.

FIG. 8 shows the timing relationship between the DRAM 25 and the SAM's 33 and 34 or 38 and 39 which constitute the output buffer means. When clear signals CLR 1 or 2 are applied to the selector 35 or 40, the 256 bits of data corresponding to the data stored in the block 0 of the DRAM 25, which is written on the SAM 1 serving as a read-out SAM, for example, the SAM 33 or 38, is outputted 4 bits at a time and simultaneously the 256 bits of data stored in the block 1 of the DRAM 25 are transferred to the SAM 2 serving as a transferring SAM, for example, the SAM 34 or 39. Secondly, the 256 bits of data corresponding to the data stored in the block 1 of the DRAM 25, which is written, on the SAM serving as the read-out SAM, is outputted 4 bits at a time and simultaneously the 256 bits of data stored in the block 2 of the DRAM 25 are transferred to the SAM 1 serving as the transferring SAM. Next, the 256 bits of data corresponding to the data stored in the block 2 of the DRAM 25, which is written on the SAM 1 serving as the read-out SAM, is outputted 4 bits at a time and simultaneously the 256 bits of data stored in the block 3 of the DRAM 25 is transferred to the SAM 2 serving as the transferring SAM. Data are transferred from the DRAM 25 to one SAM while data written on the other SAM is outputted. This operation is repeated until all of the data are read out.

According to the above-mentioned preferred embodiment of the present invention, the SAM having 256 bits of capacity, which is a sixteenth part of 4096 bits corresponding to the memory capacity per line, is used but other types of SAM'S having a capacity which is an eighth or fourth part thereof can also be used.

Figure 9:
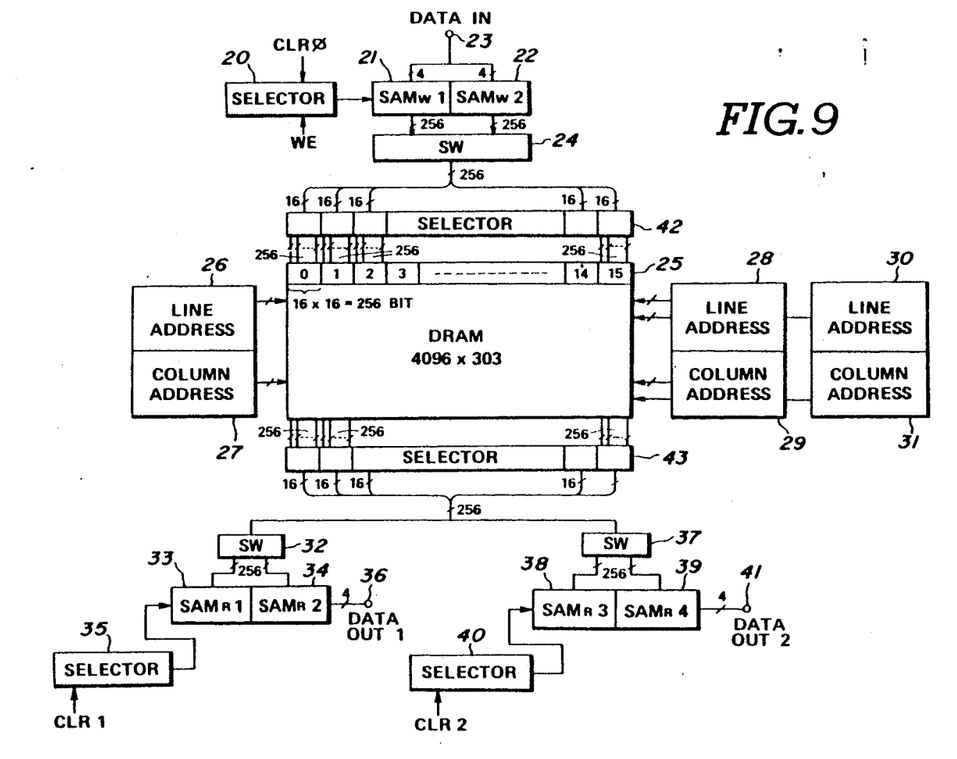
FIG. 9 is a block diagram of another preferred embodiment of a semiconductor memory according to the present invention.

FIG. 9 shows another preferred embodiment of a semiconductor memory according to the present invention. In this preferred embodiment, a selector 42 is provided between the switch 24 and the DRAM 25. The selector 42 is divided into 16 blocks corresponding to the blocks 0 to 15 of the DRAM 25. The 256-bit data lines are divided by means of the switch 24 into sixteen 16-bit data lines and introduced into each block of the selector 42 corresponding to the block 0 to 15 of the DRAM 25. A selector 43 is also provided between the DRAM 25 and the switch 32 and 37. The selector 43 is also divided into 16 blocks corresponding to the blocks 0 to 15 of the DRAM 25. Each of the 16-bit data lines is introduced from the DRAM 25 into each block of the selector 43 corresponding to the block 0 to 15 of the DRAM 25. All of the 16-bit data lines from the selector 43 are gathered together to make a 256-bit data line which is introduced into the switches 32 and 37. The selector 42 is controlled by means of address signals produced from the column-address circuit 27. The selector 43 is controlled by means of address signals produced from the column-address circuits 29 and 31.

Figure 10:
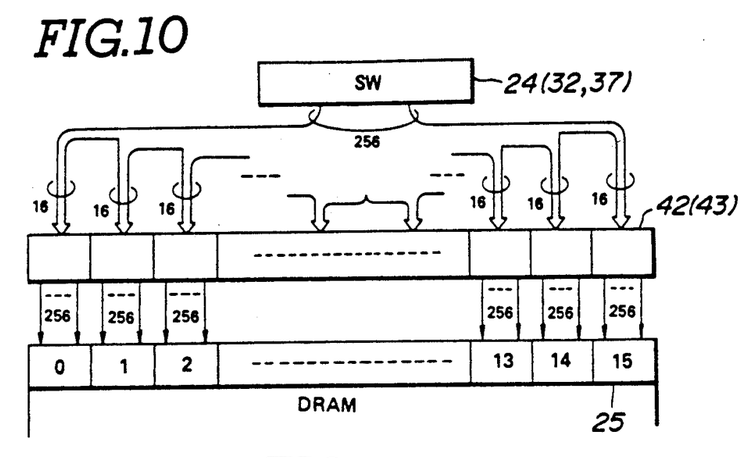
FIG. 10 is a schematic wiring diagram of the switch and the selector in FIG. 9.
Figure 11:
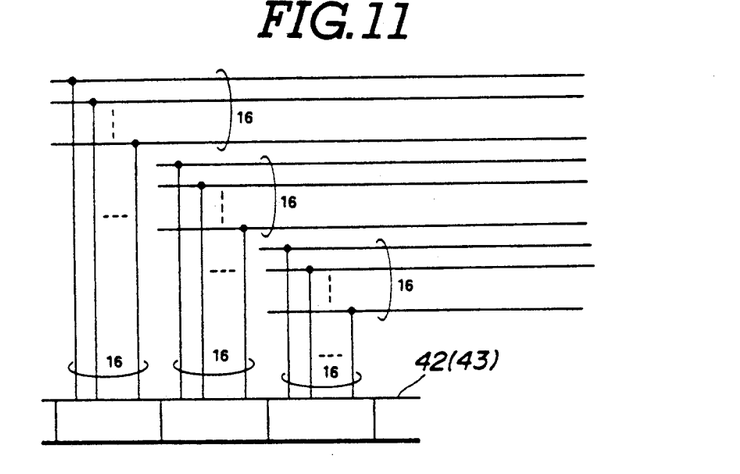
FIG. 11 is a detailed Wiring diagram in FIG. 10.

As shown in detail in FIG. 10, the 256-bit of data lines are divided by means of switch 24, 32 or 37 into, for example, two 128-bit data lines horizontally extending from near the center of the switch 24, 32 or 37 toward the left and right sides, respectively. The left-hand 128-bit data lines are introduced into the blocks of the selector 42 or 43 corresponding to the blocks 0 to 7 of the DRAM 25. The right-hand 128-bit data lines are introduced into the blocks of the selector 42 or 43 corresponding to the blocks 8 to 15 of the DRAM 25. As shown in detail in FIG. 11, each 16-bit data line selected from the 128-bit data lines extends vertically to be introduced into each block of the selector 42 or 43.

Figure 12:
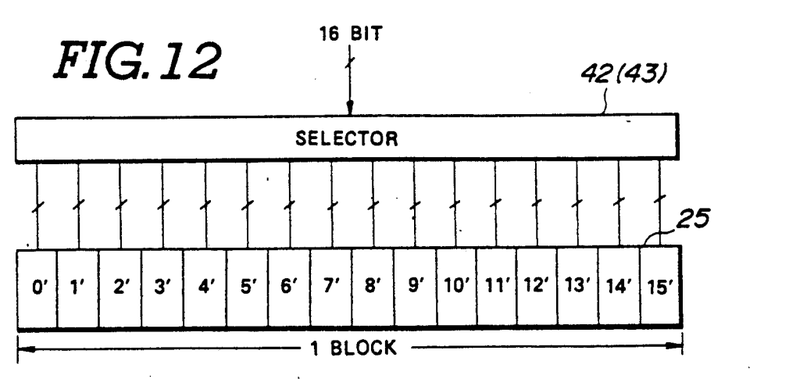
FIG. 12 is a block diagram of the block of the dynamic random-access memory used in the memory shown in FIG. 9.

In the preferred embodiment, each of the 16 blocks numbered 0 to 15 of the DRAM 25 is divided into 16 sub-blocks numbered 0' to 15' as shown in FIG. 12. The 16-bit of data is written on each of the sub-blocks by means of a block of the selector 42. On the other hand, each of the 16-bits of data written on each of the sub-blocks is read out by means of a block of the selector 43.

For example, in order to transfer the 256-bit data stored in the SAM 21 to the DRAM 25, the 256-bit of data obtained at the output terminal of the switch circuit 24 are divided into 16-bit units and each of these 16-bit data units are, in turn, transferred to one of the even-numbered sub-blocks, i.e. the sub-blocks 0', 2', 4', 6', 8', 10, 12' and 14' disposed on one of the blocks 0 to 15 of the DRAM 25 by means of each of the blocks of the selector 42. On the other hand, in order to transfer the 256-bit of data stored in the SAM 22 to the DRAM 25, the 256-bits of data obtained at the output terminal of the switch circuit 24 is divided into sixteen 16-bit data units and each of these 16-bit data units, are, in turn, transferred to one of the odd-numbered sub-blocks, i.e. the sub-blocks 1', 3', 5', 7', 9', 11, 13' and 15' disposed on one of the blocks 0 to 15 of the DRAM 25 by means of each of the blocks of the selector 42.

That is, all of the 256-bit of data stored in the same 21, 16 bits at a time, are simultaneously transferred to the sub-blocks 0' of the blocks 0 to 15 of the DRAM 25 by means of the blocks of the selector 42. Secondly, all 256 bits of data stored in the SAM 22, 16 bits by 16 bits are simultaneously transferred to the sub-blocks 1' of the blocks 0 to 15 of the DRAM 25 by means of the blocks of the selector 42. This operation is repeated for all of the other even- and odd-numbered sub-blocks.

Conversely, in order to transfer the data written on the DRAM 25 to the SAM's 33 and 34, all 16-bit of data written on one of the even-numbered sub-blocks of the blocks 0 to 15 of the DRAM 25 are simultaneously read out by means of the blocks of the selector 43 to make up 256-bit (16×16) of data so as to be transferred to the SAM 33 through the switch 32. Secondly, all of the 16-bit data units written on one of the odd-numbered sub-blocks of the blocks 0 to 15 of the DRAM 25 are simultaneously read out by means of the blocks of the selector 43 to make up 256 bits (16×16) of data to be transferred to the SAM 33 through the switch 32.

That is, all of the 16-bit data units written on the sub-blocks 0' of the blocks 0 to 15 of the DRAM 25 are simultaneously read out by means of the blocks of the selector 43 to make up 256 bits of data to be transferred to the SAM 33 through the switch 32. Secondly, all of the 16-bit data units written on the sub-blocks 1' of the blocks 0 to 15 of the DRAM 25 are simultaneously read out by means of the blocks of the selector 43 to make up 256 bits of data so as to be transferred to the SAM 34. This operation is repeated for all of the other even- and odd-numbered sub-blocks.

When the data written on the DRAM 25 are transferred to the SAM's 38 and 39, such an operation is carried out.

As mentioned above, according to the present invention, the 256 bit of data, which are alternatively transferred from the SAM's 21 and 22 to the output terminal of the switch circuit 24, are divided into sixteen 16-bit data units and all of the 16 bit data units are simultaneously transferred to the like numbered sub-blocks of the blocks 0 to 15 of the DRAM 25. All of the 16-bit data units written in the like numbered sub-blocks of the blocks 0 to 15 of the DRAM 25 are simultaneously read out to make up 256 bits of data to be transferred to the SAM's 33 and 34 or the SAM's 38 and 39. Therefore, the whole wiring area between the switch circuit 24 and the selector 42 and between the selector 43 and the switch circuits 32 and 37 can be small.

According the above-mentioned preferred embodiment of the present invention, SAM's having 256-bits of memory capacity and a DRAM having 16 horizontal blocks are used but other types of SAM and DRAM can be used.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A semiconductor memory comprising:
   a storage means for storing data, said storage means having a plurality of memory elements arranged in rows and columns;
   an input buffer means, which includes first and second memories, for receiving data input thereto and for transferring said data to said storage means, the memory capacity per row of said storage means being at least two times as large as, and a multiple of, the capacity of each of said first and second memories;
   a first switching means for transferring data stored in said first memory to said storage means while data are written into said second memory, and for transfering data stored in said second memory to said storage means while data are written into said first memory;
   an output buffer means, which include third and fourth memories, for storing data which is outputted from said storage means, and for outputting said data, the memory capacity per row of said storage means being at least twice as large as, and a multiple of, the capacity of each of said third and fourth memories; and
   a second switching means for transfering said data from said storage means into said third memory while said data previously written from said storage means into said fourth memory is output, and for transferring said data from said storage means to be stored into said fourth memory while said data previously written into said third memory is output.

2. A semiconductor memory as set forth in claim 1, comprising first and second address-designating means, connected to said storage means, for producing address signals and for designating the location in said storage means to and from which said data are transferred, respectively.

3. A semiconductor memory as set forth in claim 1, wherein said first, second, third and fourth memories of said input and output buffer means each comprises a serial-access memory.

4. A semiconductor memory as set forth in claim 1, wherein said storage means comprises a dynamic random-access memory, and each said input of data to and output of data from said storage means is in parallel.

5. A semiconductor memory as set forth in claim 1, comprising a toggle means for delaying one of said 1) transferring of said data from said input buffer means to said storage means and 2) transferring of said data from said storage means to said output buffer means with respect to the other, so as not to conflict with each other.

6. A semiconductor memory comprising:
   an input buffer means for receiving data inputted thereto, and for subsequently outputting said data in parallel;
   a storage means having a plurality of lines of memory elements for receiving and storing said data outputted in parallel from said input buffer means, and for subsequently outputting in parallel said stored data, said storage means comprising a plurality of blocks in each said line, said blocks along each said line being sequentially numbered;
   an output buffer means for storing said data outputted in parallel from said storage means, and for outputting in series said data received in parallel from said storage means;
   a dividing means for dividing said data outputted in parallel from said input buffer into smaller data units to be simultaneously written into said storage means; and
   a recombining means for recombining said smaller data units outputted in parallel from said storage means to form line data so as to be supplied to said output buffer means.

7. A semiconductor memory as set forth in claim 6, wherein said memory is connected to first and second address designating means for producing address signals for designating the location in said storage means to and from which said data are transferred, respectively.

8. A semiconductor memory as set forth in claim 3, wherein said storage means comprises a dynamic random-access memory, and each said input of data to and output of data from said storage means is in parallel.

9. A semiconductor memory as set forth in claim 6, wherein said dynamic random-access memory has said plurality of lines with said plurality of blocks in each said line, and each of said blocks is formed with a plurality of sequentially numbered sub-blocks.

10. A semiconductor memory as set forth in claim 9, wherein said dividing and recombining means include a selector having a plurality of blocks corresponding to said blocks of said dynamic random-access memory.

11. A semiconductor memory as set forth in claim 10, wherein said dividing means divides data from said input buffer means into smaller data units to be simultaneously written on a respective identically-numbered sub-block in each said block of said storage means, and wherein said recombining means recombines said smaller data units stored in said storage means at a respective identically-numbered sub-block in each said block to be written into said output buffer means.

12. A semiconductor memory as set forth in claim 9, wherein said memories of said input and output buffer means each comprises a serial-access memory.

13. A semiconductor memory as set forth in claim 6, wherein said dividing means divides data into smaller data units to be simultaneously written into respective ones of said blocks, and wherein said recombining means recombines said smaller data units stored in said storage means at respective ones of said blocks to be written on said output buffer means.

14. A semiconductor memory as set forth in claim 6, wherein said storage means is connected to first and second address-designating means for producing address signals and for designating the location in said storage means to and from which said data are transferred, respectively.

15. A semiconductor memory as set forth in claim 14, wherein said storage means is formed with a plurality of blocks in each line, and each of said blocks comprises a plurality of sequentially-numbered sub-blocks.

16. A semiconductor memory as set forth in claim 15, wherein said dividing and recombining means each include a selector having a plurality of blocks corresponding to said blocks of said storage means.

17. A semiconductor memory as set forth in claim 16, wherein said dividing means divides data into smaller data units to be simultaneously written into a respective identically-numbered sub-block in all of said blocks, and wherein said recombining means recombines said smaller data units stored in said storage means at a respective identically-numbered sub-block of all of said blocks to be written into said output buffer means.

18. A semiconductor memory comprising:
- a storage means, having a plurality of memory elements arranged in lines and formed with a plurality of blocks in each said line for storing data, each of said blocks being formed with a plurality of sequentially-numbered sub-blocks;
- input buffer means and output buffer means each having at least a pair of memories for respectively inputting or receiving data relative to said storage means, the memory capacity of said storage means being at least twice as large as, and a multiple of, the capacity of each of said memories in said input and output buffer means;
- a dividing means for dividing data into smaller data units and for simultaneously writing said smaller data units in parallel at the respective identically-numbered ones of said sub-blocks in all of said blocks in a respectively selected one of said lines; and
- a recombining means for recombining said smaller data units stored in said storage mans at the respective identically-numbered ones of said sub-blocks in all of said blocks in a respectively selected one of said lines and for reading out at least in part in series the recombined data.

* * * * *